Dec. 8, 1970 D. L. LIPKE 3,546,597

FREQUENCY DIVIDER CIRCUIT

Filed March 28, 1968 3 Sheets-Sheet 1

INVENTOR.
DONALD L. LIPKE

BY Henry K. Woodward
Attorney

INVENTOR.
DONALD L. LIPKE

BY Henry K. Woodward
Attorney

Dec. 8, 1970 D. L. LIPKE 3,546,597

FREQUENCY DIVIDER CIRCUIT

Filed March 28, 1968 3 Sheets-Sheet 3

INVENTOR.
DONALD L. LIPKE

BY Henry K. Woodward
Attorney

United States Patent Office 3,546,597 Patented Dec. 8, 1970

3,546,597
FREQUENCY DIVIDER CIRCUIT

Donald L. Lipke, Richardson, Tex., assignor to Collins Radio Company, Cedar Rapids, Iowa, a corporation of Iowa Filed Mar. 28, 1968, Ser. No. 716,767
Int. Cl. H03k 19/36, 21/36
U.S. Cl. 328—46 2 Claims

ABSTRACT OF THE DISCLOSURE

A divide by two or three frequency divider circuit includes a binary-connected flip-flop connected to receive an input clock signal and perform a divide by two function. The outputs of the flip-flop are connected to pulse generators which generate pulses at one-half the clock frequency. Clamping means are provided for clamping off the output of the first pulse generator and allowing the second pulse generator to provide a divided by two signal to an output terminal. A divide by three funtcion is achieved by controlling the clamping means whereby the first pulse generator is released and the second pulse generator is clamped in response to a control signal.

Figure 1:
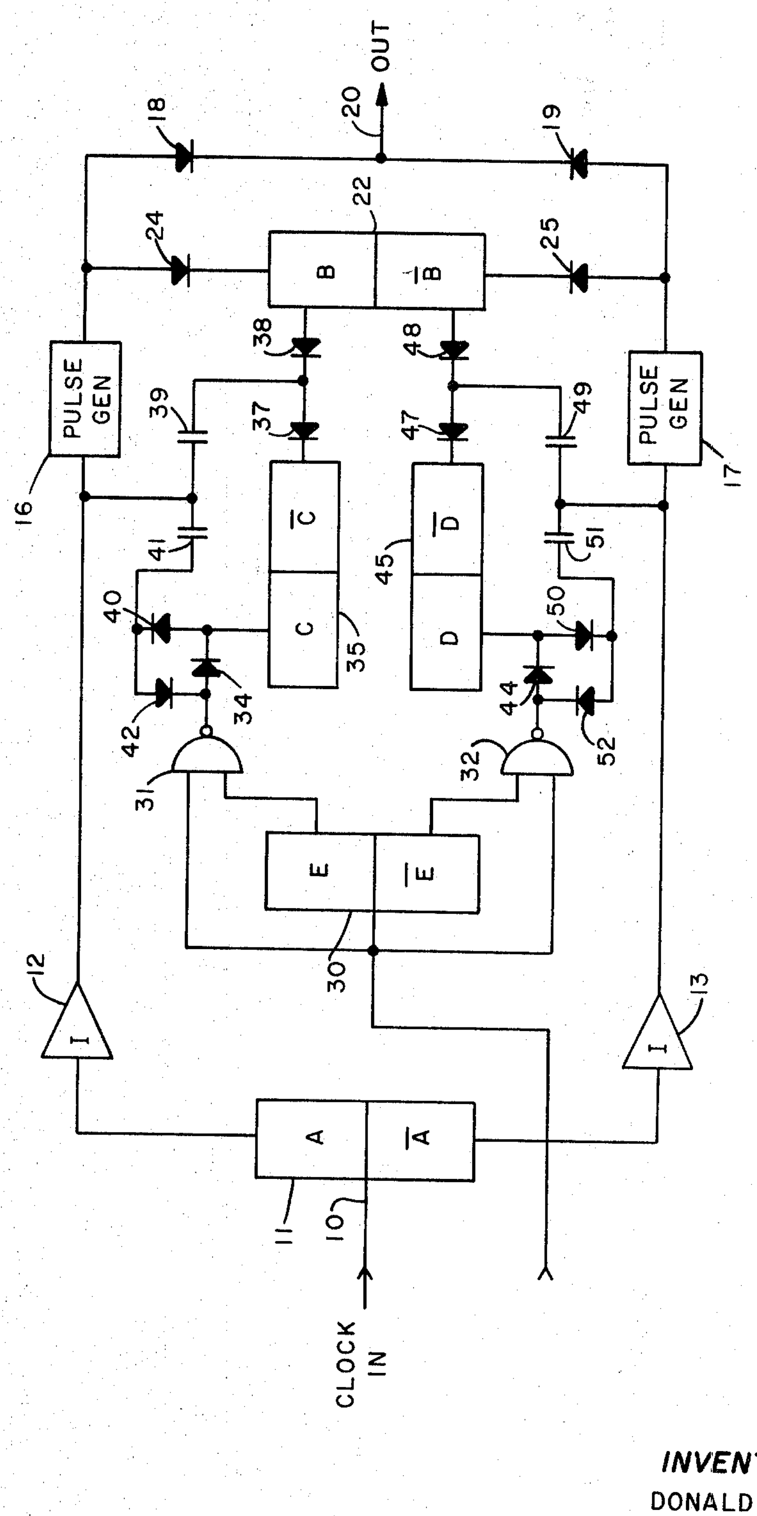

This invention relates to frequency divider circuits and, in particular, to a divider circuit especially adapted for performing divide by two or three functions in the high frequency and very high frequency ranges, but is not limited thereto.

In frequency synthesizer apparatus, desired frequency signals suitable for carrier signal applications in a communication system are obtained by frequency dividing the signal from a crystal oscillator or other oscillating signal source. Usually it is desired to obtain any one of a number of frequencies within channels in a specified frequency range. Conventional frequency divider circuits utilize a combination of flip-flops and gates to perform the frequency division function. Heretofore, conventional divide by two or three stages has required steerable (J–K type) flip-flops operating at the maximum input frequency with critical timing conditions on the reset, or divide by three, pulses.

An object of this invention is an improved variable frequency divider circuit especially suited for high frequency and very high frequency applications.

Another object of the invention is a divide by two or three frequency divider circuit requiring only one flip-flop operating at the input frequency.

Still another object of the invention is a divide by two or three frequency divider circuit which is relatively indifferent to the divide by three trigger pulse timing.

These and other objects and features of the invention will be apparent from the following description and claims when taken with the drawing.

Briefly, the frequency divider circuit in accordance with the invention includes a bistable circuit means such as a binary-connected flip-flop which has an input terminal connected to receive the input clock signal. The two output terminals of the bistable circuit means are connected to first and second pulse forming means, respectively, which form pulses corresponding in time to transitions of the voltage levels of the bistable circuit means. Clamping means are provided for clamping off the output of either of the first and second pulse forming means to produce output pulses. Control means are provided for controlling the clamping means whereby the clamping means releases one of the pulse forming means and clamps off the other pulse forming means in response to the application of a control signal to the control means.

Until the control signal is applied, the circuit divides the input clock signal by two, i.e., produces an output signal with frequency of one-half the input signal frequency. Following the application of the control signal, the circuit performs a division of the input signal by three. Thereafter, the circuit continues to divide by two until another control signal is applied to the control means.

Figure 3A:
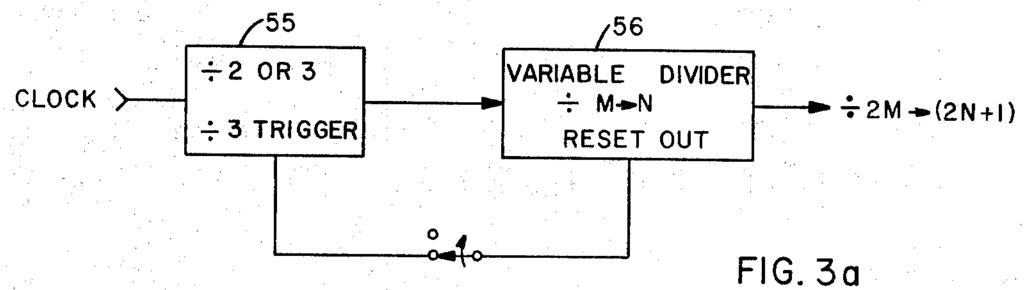
Figure 3B:
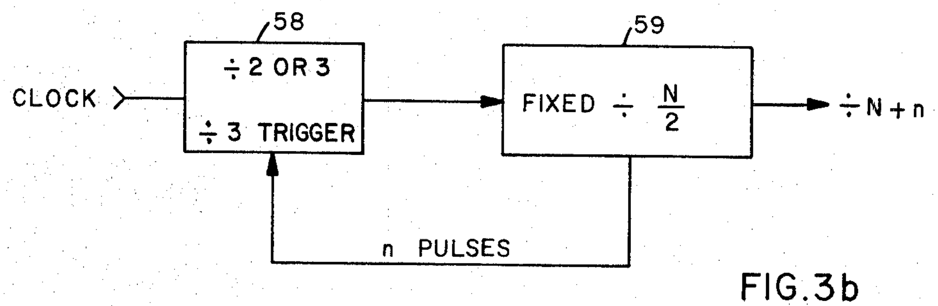
Figure 4:
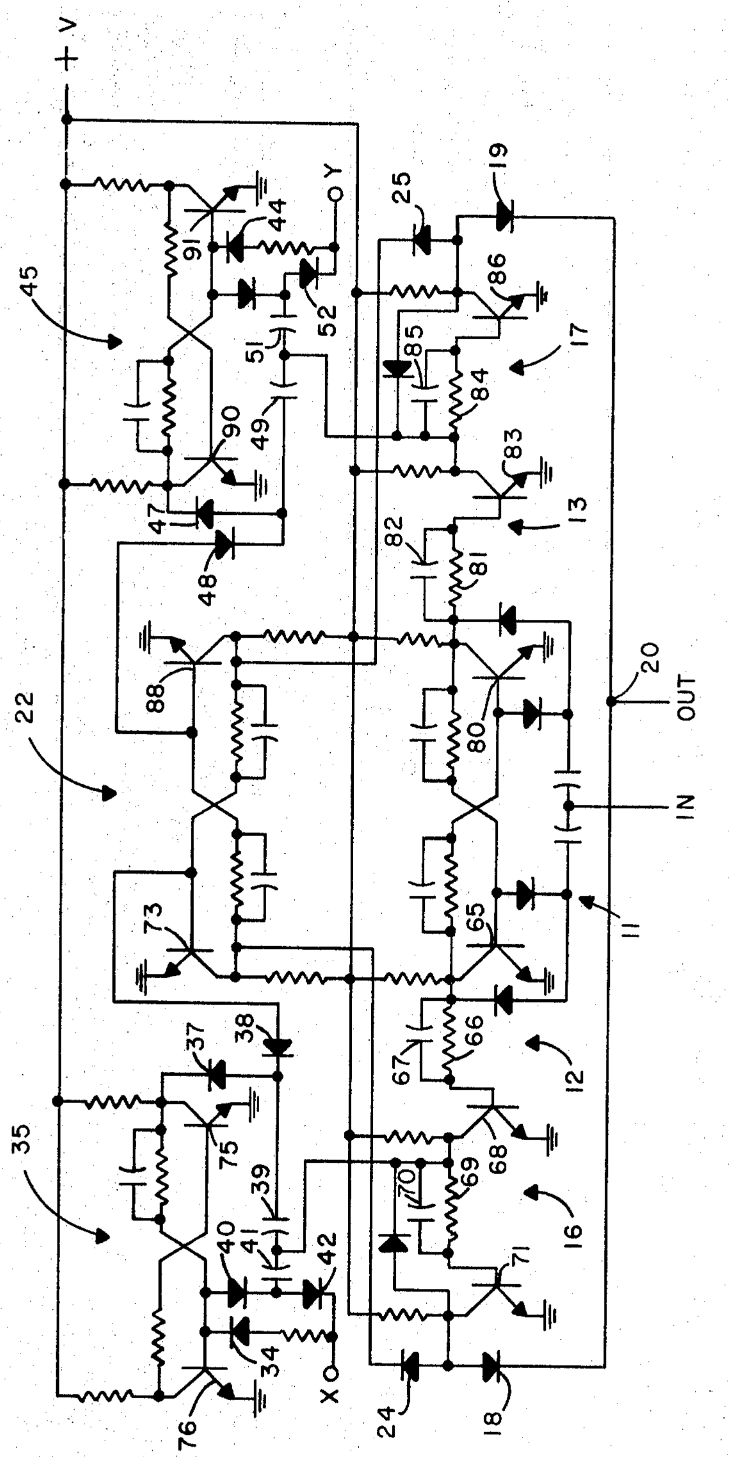

The invention will be more fully understood from the following detailed description and appended claims when taken with the drawing, in which FIG. 1 is a block diagram of one embodiment of the invention;

FIGS. 2*a*–2*f* are waveforms of voltages appearing at various points in the circuit of FIG. 1;

FIGS. 3*a* and 3*b* are block diagrams illustrating two applications of the frequency divider circuit in accordance with the invention; and FIG. 4 is a schematic circuit diagram of a portion of the circuit illustrated in FIG. 1.

Referring now to the drawings, and in particular to FIG. 1, a block diagram of a preferred embodiment of the invention is illustrated. Input terminal 10 of bistable circuit 11 is connected to receive clock input signals. Bistable circuit 11, preferably a binary-connected flip-flop, has output designated A and Not A ($\overline{A}$) which are connected to the inputs of inverter 12 and inverter 13, respectively. The outputs of inverter 12 and inverter 13 are connected respectively to the inputs of pulse generators 16 and 17. Pulse generators 16 and 17 are connected to provide positive pulses through diodes 18 and 19 to the output terminal 20 of the frequency divider circuit in response to positive going voltages at the A and $\overline{A}$ outputs of bistable circuit 11.

A second bistable circuit or flip-flop 22 having outputs designated B and $\overline{B}$ are connected through reverse polarity diodes 24 and 25 respectively to the outputs of pulse generators 16 and 17. Flip-flop 22 and diodes 24 and 25 function as a clamping means for clamping off the output of either of pulse generators 16 and 17. For example, if the B output is a "1" (higher voltage level) and output $\overline{B}$ is a "0" lower voltage level) the positive pulses from pulse generator 16 are allowed to pass through diode 18 to the output terminal 20. However, the ouput of pulse generator 17 is clamped to the lower voltage level through diode 25 and the $\overline{B}$ portion of flip-flop 22, therefore pulses from pulse generator 17 cannot reach the output terminal 20. Similarly, when B is "0" and $\overline{B}$ is "1" the output of pulse generator 16 is clamped to the lower voltage level through diode 24 and portion Z of flip-flop 22. In this state, only the positive pulses from pulse generator 17 are allowed to reach the output terminal 20.

In normal operation, the frequency divider circuit of FIG. 1 performs a divide by two function through the operation of binary-connected flip-flop 11 and either pulse generator 16 or pulse generator 17. A divide by three operation is performed by the frequency divider circuit when a control signal is applied to terminal 28 which is connected to the input of a third bistable circuit and one input each of NAND gates 31 and 32. The other inputs to NAND gates 31 and 32 are obtained from the outputs E and $\overline{E}$, respectively, of bistable circuit 30. Bistable circuit 30 also is preferably a binary-connected flip-flop.

The output of NAND gate 31 is connected through diode 34 to one input terminal of the portion of flip-flop 35 which is designated C, and the output $\overline{C}$ of flip-flop 35 is connected through serially connected and reverse polarity diodes 37 and 38 to the input of the B portion of flip-flop 22. The common terminal of diodes 37 and 38 is connected through capacitor 39 to the input terminal of pulse generator 16. The input to portion C of flip-flop 35 is also connected through serially connected diode 40 and capacitor 41 to the input terminal of pulse generator 16. Diode 42 is connected in parallel with diodes 34 and 40 to provide a path from the output of NAND gate 31 through reverse polarity diode 42 and capacitor 41 to the input terminal of pulse generator 16.

Similarly, the output of NAND gate 32 is connected through diode 44 to the input of the D portion of flip-flop 45, with the $\overline{D}$ output of flip-flop 45 being connected through reverse polarity diodes 47 and 48 to the input of the $\overline{B}$ portion of flip-flop 22. The common terminal of diodes 47 and 48 is connected through capacitor 49 to the input terminal of pulse generator 17. The input to the D portion of flip-flop 45 is connected through diode 50 and capacitor 51 to the input terminal of pulse generator 17, and the output of NAND gate 32 is connected through reverse polarity diode 52 and capacitor 51 to the input terminal of pulse generator 17.

Operation of the frequency divider circuit can best be seen by considering FIG. 1 along with the voltage levels shown in FIG. 2*a* through FIG. 2*g* which represent the voltages at various points in the circuit of FIG. 1. Consider the circuit of FIG. 1 in its normal divide by two mode of operation with pulse generator 16 providing output pulses to output terminal 20 while pulse generator 17 is clamped off. In this mode, the B output of clamping flip-flop 22 is a "1." Until a control signal is applied to terminal 28, the states of the various elements in the clamping control means are as follows:

Flip-flop 30, E="0"
Gate 31 output="1"
Gate 32 output="1"
Flip-flop 35, $\overline{C}$="1"
Flip-flop 45, $\overline{D}$="1"

Figures 2A, 2B, 2C, 2D, 2E, 2F, 2G:
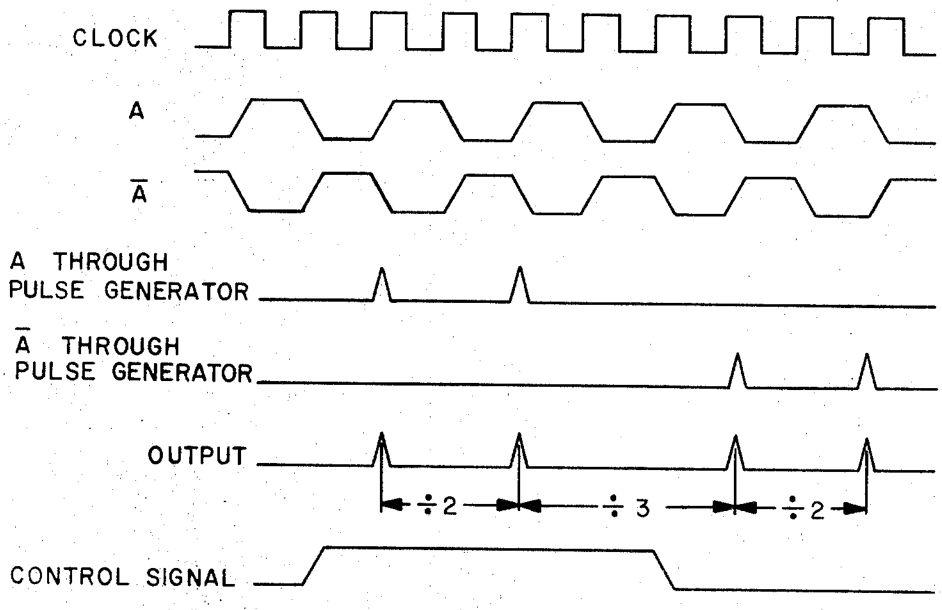

Referring to FIGS. 2*a*–2*g*, the input clock signal shown in FIG. 2*a* produces the signals from the outputs of flip-flop 11 shown in FIGS. 2*b* and 2*c* which are 180° out of phase and at one-half the clock signal frequency. The signals from the outputs of flip-flop 11 are passed through inverters 12 and 13 to the input of pulse generators 16 and 17 which produce sharp pulses in response to the leading edges of the pulse signals from the outputs of flip-flop 11. As shown in FIG. 2*d*, pulse generator 16 is producing sharp pulses which are delivered through diode 18 to output terminal 20 as represented in the output signal in FIG. 2*f*. The output of pulse generator 17 is clamped off as seen in FIG. 2*e*.

Upon the application of a control signal to terminal 28, as seen in FIG. 2*g*, the output of gate 32 goes to "0" and allows capacitor 51 to charge on the next leading edge of a pulse coming from inverter 13. The trailing edge of the pulse coming from inverter 13 allows capacitor 51 to discharge through diode 50 and trigger the D portion of flip-flop 45 to the "1" state and consequently the $\overline{D}$ portion of flip-flop 45 goes to "0." The leading edge of the next pulse from inverter 13 can now charge capacitor 49 through diode 47 into the $\overline{D}$ portion of flip-flop 45, and the following trailing edge of the pulse from inverter 13 allows capacitor 49 to discharge through diode 48 into the $\overline{B}$ portion of flip-flop 22 and causes $\overline{B}$ to flip to "1." When the $\overline{B}$ portion of flip-flop 22 changes to a "1," the B portion of flip-flop 22 changes to a "0" and provides a clamp on the output of pulse generator 16. As seen in FIG. 2*d*, no further pulses appear at the output of pulse generator 16 while pulses do appear at the output of pulse generator 17 in response to the subsequent leading edges of the pulses from the $\overline{A}$ portion of flip-flop 11 following the transition of the state of flip-flop 22. As seen in FIG. 2*f*, the input clock signal is divided by three in response to the application of the control signal to terminal 28. Thereafter, the frequency divider circuit continues to divide the input clock signal by two with pulse generator 17 providing the output pulses. Upon the application of another control signal to terminal 28, the process repeats itself with pulse generator 17 again being clamped off. Thus, the circuit performs one divide by three operation in response to each control signal pulse applied to terminal 28.

The timing of the application of the control signal to terminal 28 is not critical, however the duration of the control signal must be longer than four periods of the clock frequency, in order for the control means for the clamping flip-flop 22 to function properly.

Applications of the voltage divider circuit in accordance with the invention are varied. The normal use of a divide by two or three stage in a variable divider is shown in FIG. 3*a* where the stage 55 is used only to determine whether the division ratio is even or odd. In this arrangement only one control signal is fed from the variable divider 56 through switch 57 to the control terminal of circuit 55 whenever an odd division ratio is desired, and for an even count the reset pulse is gated off allowing the circuit 55 to divide by two only. Thus, if the variable divider 56 can divide by M through N, the combined circuitry will divide by 2M through $2N+1$.

FIG. 3*b* illustrates another application of the divider circuit. The divide by two or three circuit 58 is operated in conjunction with a fixed divide by $N/2$ circuit 59 with $n$ pulses being fed from circuit 59 to the control terminal of circuit 58. This produces an effective divide by $(N+n)$ frequency divider circuit so long as $n$ is no greater than $N/4$. For a wider division ratio change, the frequency divider circuit 59 can be made variable, also.

A schematic circuit diagram of a portion of the circuit shown in block form in FIG. 1 is illustrated in FIG. 4. Description of the schematic will not be detailed since most of the elements are conventional circuits and the operation is the same as described above with respect to FIG. 1. To facilitate the understanding of the schematic, like elements in FIG. 4 and in FIG. 1 have the same reference numerals. Flip-flop 30 and NAND gates 31 and 32 are not shown in FIG. 4.

The A output of flip-flop 11 is taken at the collector of transistor 65 and is passed through resistor 66 and shunt capacitor 67 to the base of transistor 68, all of which comprise inverter 12. The output of inverter 12 is taken at the collector of transistor 68 and is passed through resistor 69 and shunt capacitor 70 to the base of transistor 71, all of which comprise pulse generator 16. The collector of transistor 71 is connected through diode 24 to the B output of flip-flop 22 which is at the collector of transistor 73. The B portion input of flip-flop 22, which is the base of transistor 73, is connected through diodes 38 and 37 to the $\overline{C}$ output of flip-flop 35, which is at the collector of transistor 75. The C portion input of flip-flop 35 at the base of transistor 76 is connected through diode 40 and capacitor 41 to the input of pulse generator 16. The output of gate 31 of FIG. 1, which is designated "X" in FIG. 4, is connected through diode 42 to the common terminal of diode 40 and capacitor 41.

Similarly, the $\overline{A}$ output of flip-flop 11, which is taken at the collector of transistor 80, is passed through resistor 81 and shunt capacitor 82 to the base of transistor 83, all of which comprise inverter 13. The output of inverter 13 taken at the collector of transistor 83 is applied through resistor 84 and shunt capacitor 85 to the base of transistor 86, all of which comprise pulse generator 17. The output of pulse generator 17 taken at the collector of transistor 86, is connected through diode 25 to the $\overline{B}$ output of flip-flop 22 which is at the collector of transistor 88. The $\overline{B}$ portion input of flip-flop 22 taken at the base of transistor 88 is connected through diode 48 and diode 47 to the $\overline{D}$ output of flip-flop 45, which is taken at the collector of transistor 90. The common terminal of diodes 47 and 48 is connected through capacitor 49 to the input of pulse generator 17. The output of gate 32 shown in FIG. 1, designated "Y" in FIG. 4, is connected through diode 52 and capacitor 51 to the input of pulse generator 17. The output "Y" of gate 32 is also connected through a current limiting resistor and diode 44 to the input of the D portion of flip-flop 45 which is at the base of transistor 91. The output of pulse generator 16, taken at the collector of transistor 71, is connected through diode 18 to the output terminal 20, and the output of pulse generator 17, taken at the collector of transistor 86 is connected through diode 19 to the output terminal 20.

The circuit operates as described above with respect to FIG. 1. This particular circuit is designed to operate in the very high frequency range. It will be appreciated by those skilled in the art that other bistable circuits, gating arrangements, pulse generators or differentiators, inverters, and the like can be employed, depending to a degree on the clock input frequency. Further, circuitry employing PNP transistors rather than the NPN transistors illustrated in FIG. 4 can be used.

While the invention has been described with reference to specific embodiments, it is to be understood that the description is illustrative and is not to be construed as limiting the scope of the invention. Various modifications and changes may occur to those skilled in the art without departing from the spirit and scope of the invention as defined by the appended claims.

What is claimed is:

1. A frequency divider circuit comprising (a) a first bistable circuit means having a trigger input terminal and two output terminals with said trigger input terminal connected to receive an input signal at an input frequency, (b) first and second pulse forming means connected with said two output terminals of said bistable circuit means for generating electrical pulses at one-half the input frequency, (c) output means connected to receive the electrical pulses generated by said first and second pulse forming means, (d) clamping means for clamping off the output of either of said first and second pulse forming means thereby permitting only one of said first and second pulse forming means to produce output pulses, said clamping means including a second bistable circuit means having two output terminals, and first and second unidirectional conducting means connecting said two output terminals of said second bistable circuit means to respective output terminals of said first and second pulse forming means, and (e) control means for controlling said clamping means whereby said clamping means releases one of said pulse forming means and clamps off the other of said pulse forming means in response to a control signal applied to said control means, said control means including a third bistable circuit means having an input and two outputs and first and second gates each having inputs connected to receive said control signal and with the outputs of said third bistable circuit means connected to inputs of said first and second gates, fourth and fifth bistable circuit means, said first and second gates being operatively connected with said fourth and fifth bistable circuit means respectively whereby the application of a control signal to said control means causes one of said first and second gates to deliver a trigger pulse to either of said fourth and fifth bistable circuit means, said fourth and fifth bistable circuit means being operatively connected with said second bistable circuit means whereby the triggering of either of said fourth and fifth bistable circuit means by the application of said control signal causes the subsequent triggering of said second bistable circuit means.

2. A divide by two or three frequency divider circuit comprising (a) a binary-connected first flip-flop having an input terminal connected to receive an input signal at a first frequency and two output terminals for producing output signals at one-half of said first frequency.

(b) first and second pulse forming means connected to said two output terminals of said first flip-flop for generating pulses at one-half of said first frequency, (c) a second flip-flop having two output terminals with first and second diodes connecting said two output terminals of said second flip-flop to the output terminals of said first and second pulse forming means thereby clamping off the output of one of said first and second pulse forming means, and (d) control means for controlling said second flip-flop and having an input terminal for receiving a control signal whereby said second flip-flop flips after a control signal is applied to said control means, said control means including a binary-connected third flip-flop and first and second NAND gates each having an input connected to receive said control signal and with the outputs of said third flip-flop connected to inputs of said NAND gate, fourth and fifth flip-flops, said first and second NAND gates being operatively connected with said fourth and fifth flip-flops respectively whereby the application of a control signal to said control means causes one of said first and second NAND gates to deliver a trigger pulse to one of said fourth and fifth flip-flops, said fourth and fifth flip-flops being operatively connected with said second flip-flop whereby the triggering of one of said fourth and fifth flip-flops by the application of said control signal causes the subsequent triggering of said second flip-flop.

References Cited

UNITED STATES PATENTS

| | | | |
|---|---|---|---|
| 2,853,559 | 9/1958 | Leonard | 328—153X |
| 3,153,733 | 10/1964 | De Bolt et al. | 307—247X |
| 3,158,692 | 11/1964 | Gerkensmeier | 307—244X |
| 3,263,188 | 7/1966 | Sloan | 307—242X |
| 3,430,067 | 2/1967 | Baum | 307—225 |

JOHN S. HEYMAN, Primary Examiner

U.S. Cl. X.R.

307—215, 237, 242; 328—42, 152, 215